(12) United States Patent
Abedifard

(10) Patent No.: US 8,953,396 B2
(45) Date of Patent: *Feb. 10, 2015

(54) NAND INTERFACE

(75) Inventor: Ebrahim Abedifard, Sunnyvale, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/073,360

(22) Filed: Mar. 28, 2011

(65) Prior Publication Data

US 2011/0173382 A1 Jul. 14, 2011

Related U.S. Application Data

(63) Continuation of application No. 11/739,717, filed on Apr. 25, 2007, now Pat. No. 7,916,557.

(51) Int. Cl.
*G11C 7/00* (2006.01)
*G11C 8/04* (2006.01)
*G11C 16/08* (2006.01)

(52) U.S. Cl.
CPC ........ *G11C 8/04* (2013.01); *G11C 16/08* (2013.01); *G11C 2216/30* (2013.01)
USPC .......... 365/191; 365/51; 365/83; 365/185.17; 365/221

(58) Field of Classification Search
USPC .................. 365/51, 83, 185.17, 191, 221
See application file for complete search history.

(56) References Cited

U.S. PATENT DOCUMENTS

| | | | | |
|---|---|---|---|---|
| 5,835,936 | A * | 11/1998 | Tomioka et al. | 711/103 |
| 5,901,293 | A | 5/1999 | Claxton | |
| 5,966,723 | A * | 10/1999 | James et al. | 711/103 |
| 6,137,710 | A | 10/2000 | Iwasaki et al. | |
| 6,317,812 | B1 * | 11/2001 | Lofgren et al. | 711/154 |
| 6,397,361 | B1 | 5/2002 | Saitoh | |
| 6,519,194 | B2 * | 2/2003 | Tsujino et al. | 365/201 |
| 6,611,935 | B1 | 8/2003 | Landry | |
| 7,038,946 | B2 | 5/2006 | Hosono et al. | |
| 7,130,958 | B2 | 10/2006 | Chou et al. | |
| 7,167,411 | B2 | 1/2007 | Ahn | |
| 7,296,143 | B2 | 11/2007 | Gaskins et al. | |
| 2005/0146981 | A1 * | 7/2005 | Ahn | 365/233 |
| 2006/0067123 | A1 * | 3/2006 | Jigour et al. | 365/185.05 |

FOREIGN PATENT DOCUMENTS

| | | |
|---|---|---|
| EP | 1424635 | 6/2004 |
| EP | 1764803 | 3/2007 |

* cited by examiner

*Primary Examiner* — Thao H Bui
(74) *Attorney, Agent, or Firm* — Dicke, Billig & Czaja, PLLC

(57) ABSTRACT

A NAND interface having a reduced pin count configuration, in which all command and address functions and operations of the NAND are provided serially on a single serial command and address pin, and data is transmitted over data pins in response to commands and addresses received on the serial command and address pin.

27 Claims, 5 Drawing Sheets

| STD NAND | TSOP x8 | | STD NAND |
|---|---|---|---|
| NC | 1 | 48 | VSSQ |
| NC | 2 | 47 | NC |
| NC | 3 | 46 | NC |
| NC | 4 | 45 | NC |
| NC | 5 | 44 | I/O7 |
| NC | 6 | 43 | I/O6 |
| R/B# | 7 | 42 | I/O5 |
| RE# | 8 | 41 | I/O4 |
| CE# | 9 | 40 | NC |
| NC | 10 | 39 | VCCQ |
| NC | 11 | 38 | NC |
| Vcc | 12 | 37 | Vcc |
| Vss | 13 | 36 | Vss |
| NC | 14 | 35 | NC |
| NC | 15 | 34 | VCCQ |
| CLE | 16 | 33 | NC |
| ALE | 17 | 32 | I/O3 |
| WE# | 18 | 31 | I/O2 |
| WP# | 19 | 30 | I/O1 |
| NC | 20 | 29 | I/O0 |
| NC | 21 | 28 | NC |
| NC | 22 | 27 | NC |
| NC | 23 | 26 | NC |
| NC | 24 | 25 | VSSQ |

Middle area: 48-pin TSOP Type I

FIG. 5
Prior Art

NAND INTERFACE

RELATED APPLICATION

This Application is a Continuation of U.S. application Ser. No. 11/739,717, titled "NAND INTERFACE," filed Apr. 25, 2007, now U. S. Pat. No. 7,916,557 B2 which is commonly assigned and incorporated herein by reference.

FIELD

The present disclosure relates generally to memories and in particular the present disclosure relates to NAND memory interfaces.

BACKGROUND

Memory devices are typically provided as internal, semiconductor, integrated circuits in computers or other electronic devices. There are many different types of memory including random-access memory (RAM), read only memory (ROM), dynamic random access memory (DRAM), synchronous dynamic random access memory (SDRAM), and flash memory.

Flash memory devices have developed into a popular source of non-volatile memory for a wide range of electronic applications. Flash memory devices typically use a one-transistor memory cell that allows for high memory densities, high reliability, and low power consumption. Changes in threshold voltage of the cells, through programming of charge storage or trapping layers or other physical phenomena, determine the data value of each cell. Common uses for flash memory include personal computers, personal digital assistants (PDAs), digital cameras, digital media players, digital recorders, games, appliances, vehicles, wireless devices, cellular telephones, and removable memory modules, and the uses for flash memory continue to expand.

Flash memory typically utilizes one of two basic architectures known as NOR flash and NAND flash. The designation is derived from the logic used to read the devices. In NOR flash architecture, a column of memory cells are coupled in parallel with each memory cell coupled to a bit line. In NAND flash architecture, a column of memory cells are coupled in series with only the first memory cell of the column coupled to a bit line.

As densities of memory devices continue to increase, and as supply voltages continue to decrease, overall system power consumption can become an issue. Power consumption is a continuing concern in memory design.

For the reasons stated above, and for other reasons stated below which will become apparent to those skilled in the art upon reading and understanding the present specification, there is a need in the art for power consumption reductions in memory devices.

BRIEF DESCRIPTION OF DRAWINGS

FIG. 5 is a block diagram of a prior art NAND interface with a standard pinout configuration.

DETAILED DESCRIPTION

Figure 1:
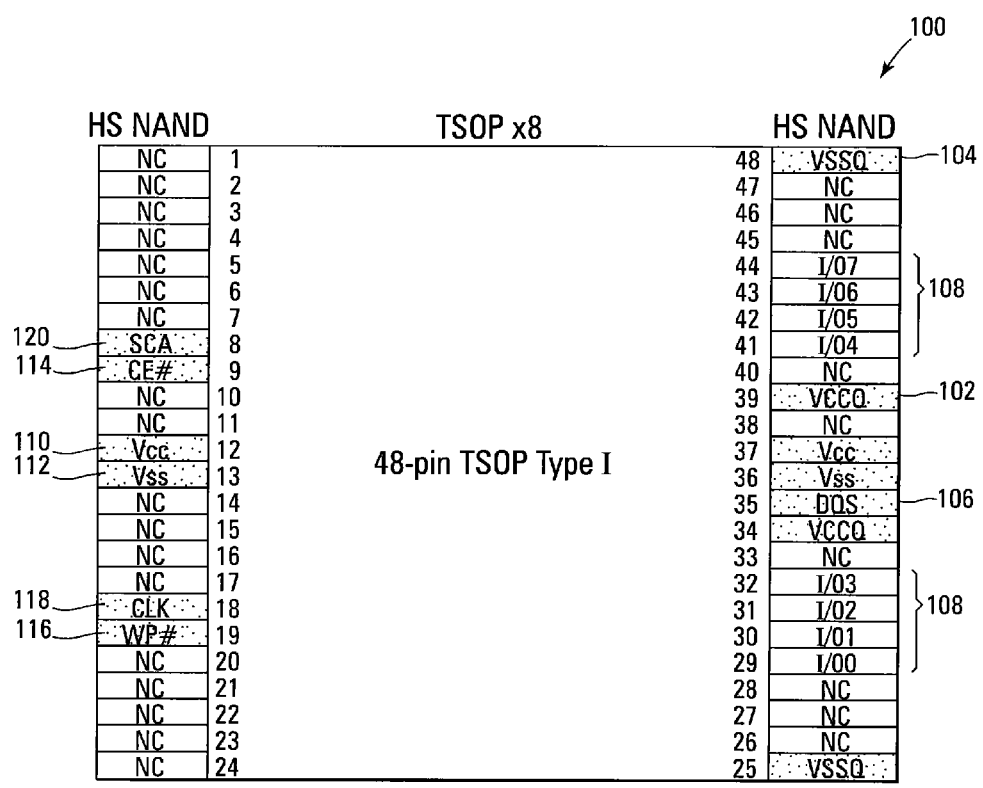
FIG. 1 is a block diagram of a NAND interface according to one embodiment.

In the following detailed description of the embodiments, reference is made to the accompanying drawings that form a part hereof. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention.

The following detailed description is, therefore, not to be taken in a limiting sense, and the scope of the present disclosure is defined only by the appended claims, along with the full scope of equivalents to which such claims are entitled.

A high speed NAND interface 100 according to one embodiment is shown in FIG. 1. NAND interface 100 has a reduced pin count compared to a conventional NAND interface. Compared to a standard NAND as shown in FIG. 5, this reduces overall system power consumption, since fewer pins are powered. A pinout arrangement according to one embodiment includes a plurality of I/O pins and an additional reduced set of other pins. The number of I/O pins is variable depending upon the I/O requirements of the device. Data transfer in and out of the device may be single or double data rate, that is clocked on only rising edges, or on both rising and falling edges of the a clock signal input. All input and output I/O operations of the various embodiments are synchronized with the DQS pin. Further, a controller or processor interfacing with the NAND embodiments herein requires fewer pins to drive the NAND, and therefore the controller will be simpler and have a lower cost than controllers for standard NAND devices.

NAND devices are input/output (I/O) intensive. The number of I/O pins of a NAND device define how much data can be transmitted into and out of the device. DQ pin count for a NAND is generally fixed, that is that every NAND has a number of DQ pins. The number of DQ pins will be the same for a standard NAND and for the NAND embodiments described herein. The embodiments have fewer non-DQ pins. For example, a NAND can have eight DQ pins, 16 DQ pins, or another number of DQ pins chosen depending upon the amount of data to be transmitted into and out of the memory.

A typical NAND pinout configuration includes a number of DQ pins, as well as a number of other pins. The other pins include, by way of example only and not by way of limitation, write enable (WE#), read enable (RE#), ready/busy (R/b#), command latch enable (CLE), address latch enable (ALE), clock (CLK), power supply (VCC and VSS), I/O power supply (VCCIO and VSSIO), data strobe (DQS), chip enable input (CE#), and write protect (WP#). Commands are passed to the memory via command latch enable, address latch enable, write and read enable, and R/b# pins. A command set for a traditional NAND device typically contains a number of command lines The embodiments described herein combine a number of signals typically provided on different pins onto a single pin, providing input serially on that single pin. This configuration eliminates in one embodiment the need for separate write enable, read enable, R/b#, command latch enable (CLE), and address latch enable (ALE) pins. Further, the write protect (WP#) pin 116 is also optional, since the serial nature of command input on the SCA performs many of the write protect pin functions.

In the device 100, pins used include dedicated I/O supplies VCCIO 102 and VSSIO 104, data strobe pin (DQS) 106, data I/O pins (DQs) 108, power supplies VCC 110 and VSS 112, chip enable 114, write protect 116, clock 118, and serial command and address (SCA) 120. The I/O pins 108 are organized for high speed configuration and supplied with dedicated I/O supplies VCCIO 102 and VSSIO 104. The DQS pin 106 is used for system data input and output bus synchronization. Control signals for read/write operations, commands, and addresses for this embodiment are provided on a single serial command and address (SCA) input pin.

A typical NAND command structure controls large data streams into and out of the memory. The command cycle is a small portion of the throughput of the memory. In one embodiment, all control pins of a memory are combined onto a single serial command address pin. That is, all control pins that define read/write (commands and addresses) are combined onto a single serial pin. All commands and addresses are serially entered on the SCA pin 120.

For serial access to be recognized, a command structure that the NAND recognizes is used. A start condition is used in one embodiment. When the start condition is met through the receipt of a specific signal, for example, the SCA pin is ready for commands. A typical, but not required, set of commands for the SCA pin includes a start instruction, a command, an address, and an optional end or confirm instruction. Alternatively, a start instruction can be followed in various embodiments by a device designator, command, address, and end or confirm instruction. The exact structure of the inputs on the SCA pin is subject to variation depending upon the function and operability of the device.

Operation of various pins in the embodiments is as follows. The clock input (CLK) pin is connected to a system clock, and runs all the time. To reduce standby current, the internal clock is optionally shut down with a command given on the SCA pin. Serial command and address input (SCA)—command and address information is serially input on this pin. The SCA is synchronized to the system clock. Command and address information starts in one embodiment from a falling edge of a chip enable signal and terminates with a rising edge of the chip enable signal. Commands and addresses are sequentially entered when CE# is low, and SCA it is synchronized with system clock (CLK) input. Only successful signals are accepted. Any deviation is ignored. Data is read out from DQ pins synchronized with the DQS pin. Data is output after successful command entry followed by a transition of CE# from high to low. Power is supplied to the device and to the I/O pins through pins VCC, VSS, VCCIO, and VSSIO.

Figure 2:
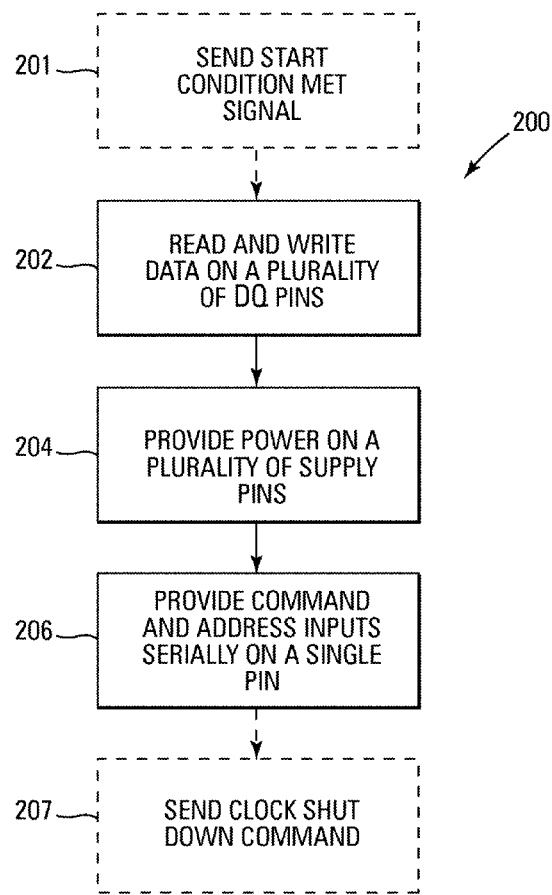
FIG. 2 is a flow chart diagram of a method according to another embodiment.

One method of operation 200 is shown in FIG. 2. Method 200 comprises reading and writing data on a plurality of input/output pins in block 202, providing power on a plurality of power supply pins in block 204, and providing command and address inputs serially on a single pin in block 206. The NAND configurations of the various embodiments use a serial command bus for all command and address functions for the memory. Optionally, as described above, a start condition met signal is sent in block 201. Also optionally, a clock shut down command is sent in block 207.

Figure 3:
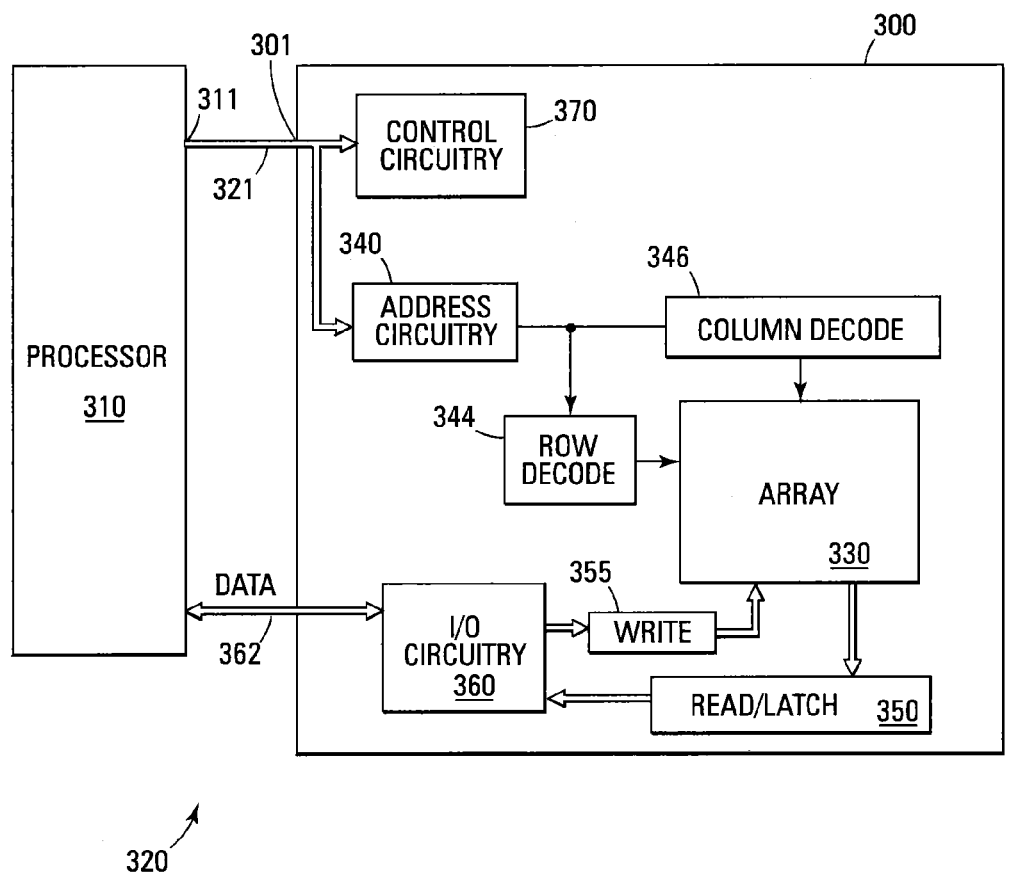
FIG. 3 is a functional block diagram of an electrical system having at least one memory device with a memory array configuration according to one embodiment of the present invention.

FIG. 3 is a functional block diagram of a memory device 300, such as a flash memory device, of one embodiment of the present invention, which is coupled to a processor 310. The memory device 300 and the processor 310 may form part of an electronic system 320. The memory device 300 has been simplified to focus on features of the memory that are helpful in understanding the present invention. The memory device includes an array of memory cells 330 having a modified pinout configuration and having a single SCA pin 301 for command and address inputs such as those shown in FIG. 1 and described above. The memory array 330 is arranged in banks of rows and columns.

Many processors such as processor 310 contain a serial peripheral interface (SPI) pin to provide a reduced pin count interface between processors and various devices such as memory devices Existing addresses and command functions are in one embodiment provided to the SCA pin 301 on a processor SPI pin 311. Alternatively, the processor 310 uses a logic block or circuit, either internal or external to the processor, to serially combine command and address information for provision to the SCA pin 301 of the memory 300.

An address buffer circuit 340 is provided to latch address signals provided from processor 310 on SPI pin 311 along connections 321 to SCA pin 301. Address signals are received at SCA pin 301 and decoded by row decoder 344 and a column decoder 346 to access the memory array 330. It will be appreciated by those skilled in the art, with the benefit of the present description, that the number of address input connections depends upon the density and architecture of the memory array. That is, the number of addresses increases with both increased memory cell counts and increased bank and block counts.

The memory device reads data in the array 330 by sensing voltage or current changes in the memory array columns using sense/latch circuitry 350. The sense/latch circuitry, in one embodiment, is coupled to read and latch a row of data from the memory array. Data input and output buffer circuitry 360 is included for bi-directional data communication over a plurality of data (DQ) connections 362 with the processor 310, and is connected to write circuitry 355 and read/latch circuitry 350 for performing read and write operations on the memory 300.

Command control circuit 370 decodes signals provided on from the processor 310 along connection 321 through SCA pin 301. These signals are used to control the operations on the memory array 330, including data read, data write, and erase operations. The flash memory device has been simplified to facilitate a basic understanding of the features of the memory. A more detailed understanding of internal circuitry and functions of flash memories are known to those skilled in the art.

Figure 4:
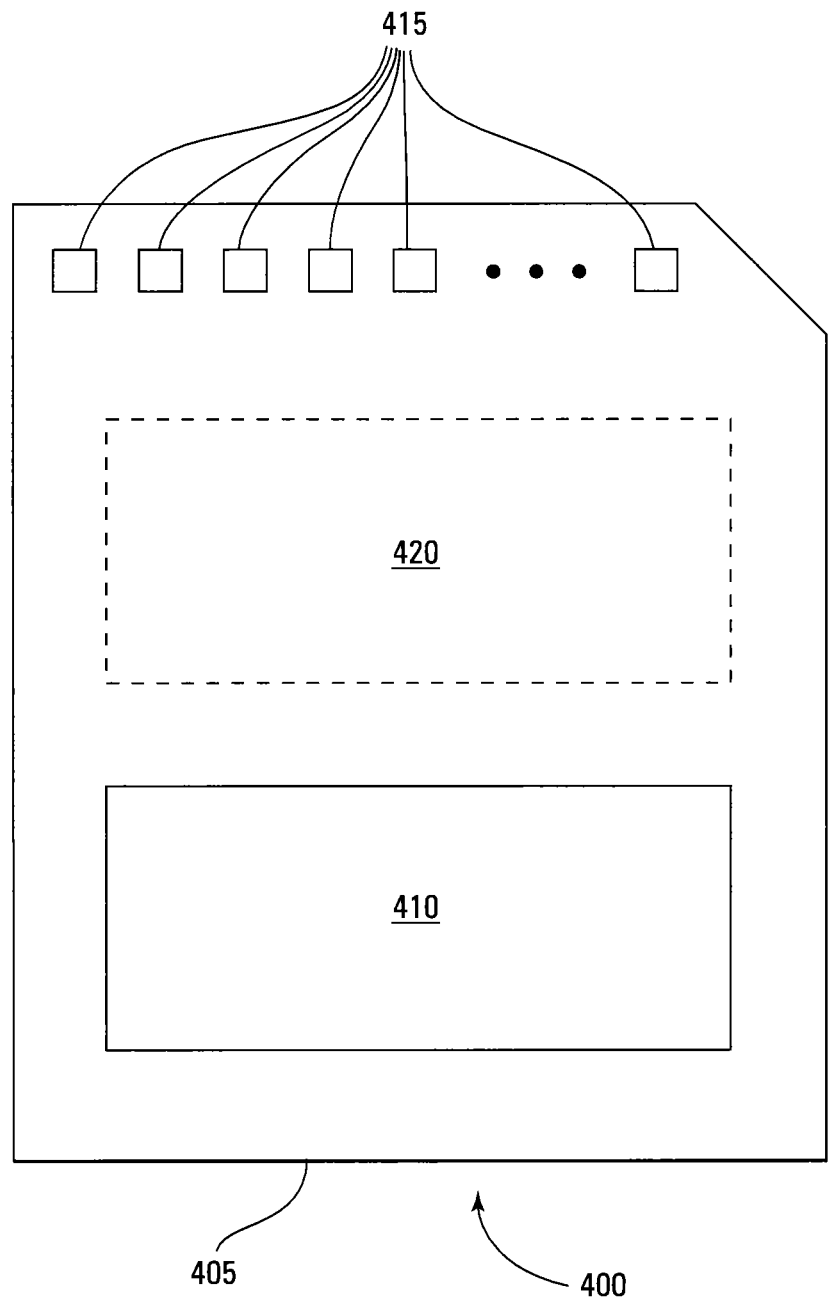
FIG. 4 is a functional block diagram of a memory module having at least one memory device in accordance with an embodiment of the invention.

FIG. 4 is an illustration of an exemplary memory module 400. Memory module 400 is illustrated as a memory card, although the concepts discussed with reference to memory module 400 are applicable to other types of removable or portable memory, e.g., USB flash drives, and are intended to be within the scope of "memory module" as used herein. In addition, although one example form factor is depicted in FIG. 4, these concepts are applicable to other form factors as well.

In some embodiments, memory module 400 will include a housing 405 (as depicted) to enclose one or more memory devices 410, though such a housing is not essential to all devices or device applications. At least one memory device 410 is a non-volatile memory including a serial command and address (SCA) pin and a reduced pinout configured memory as described above and according to various embodiments of the present invention. Where present, the housing 405 includes one or more contacts 415 for communication with a host device. Examples of host devices include digital cameras, digital recording and playback devices, PDAs, personal computers, memory card readers, interface hubs and the like. For some embodiments, the contacts 415 are in the form of a standardized interface. For example, with a USB flash drive, the contacts 415 might be in the form of a USB Type-A male connector. For some embodiments, the contacts 415 are in the form of a semi-proprietary interface. In general, however, contacts 415 provide an interface for passing control, address and/or data signals between the memory module 400 and a host having compatible receptors for the contacts 415.

The memory module 400 may optionally include additional circuitry 420 which may be one or more integrated circuits and/or discrete components. For some embodiments, the additional circuitry 420 may include a memory controller for controlling access across multiple memory devices 410 and/or for providing a translation layer between an external host and a memory device 410. For example, there may not be a one-to-one correspondence between the number of contacts 415 and a number of I/O connections to the one or more memory devices 410. Thus, a memory controller could selectively couple an I/O connection (not shown in FIG. 4) of a memory device 410 to receive the appropriate signal at the appropriate I/O connection at the appropriate time or to provide the appropriate signal at the appropriate contact 415 at the appropriate time. Similarly, the communication protocol between a host and the memory module 400 may be different than what is required for access of a memory device 410. A memory controller could then translate the command sequences received from a host into the appropriate command sequences to achieve the desired access to the memory device 410. Such translation may further include changes in signal voltage levels in addition to command sequences.

The additional circuitry 420 may further include functionality unrelated to control of a memory device 410 such as logic functions as might be performed by an ASIC (application specific integrated circuit). Also, the additional circuitry 420 may include circuitry to restrict read or write access to the memory module 400, such as password protection, biometrics or the like. The additional circuitry 420 may include circuitry to indicate a status of the memory module 400. For example, the additional circuitry 420 may include functionality to determine whether power is being supplied to the memory module 400 and whether the memory module 400 is currently being accessed, and to display an indication of its status, such as a solid light while powered and a flashing light while being accessed. The additional circuitry 420 may further include passive devices, such as decoupling capacitors to help regulate power requirements within the memory module 400.

When a standard NAND is busy, only a limited number of commands are available for access to the NAND. In contrast, the embodiments of NAND described herein using an SCA pin allow, using SCA pin allow the assertion of any command even while the NAND is busy, since the commands are input serially, and is not executed until the internal operation is completed. Serially entering the command allows pipelining of commands. There is no restriction of commands since the commands are input serially to the SCA pin.

Further, the SCA pin of the various embodiments is in another embodiment is a bi-directional communication pin that can received commands and addresses, as well as communicate to an external component. In this manner, for example, if the DQ pins are busy, an acknowledgement of command received or operation is made on the SCA.

CONCLUSION

A NAND interface and methods of operating a NAND device have been described that include a reduced pin count configured memory device in which all of the command and address information is provided serially on a single pin, a serial command and address pin (SCA). The serial provision of command and address information on the SCA pin reduces the power consumption of the memory by reducing the pin count.

Although specific embodiments have been illustrated and described herein, it will be appreciated by those of ordinary skill in the art that any arrangement, which is calculated to achieve the same purpose, may be substituted for the specific embodiment shown. This application is intended to cover any adaptations or variations of the present invention. Therefore, it is manifestly intended that this invention be limited only by the claims and the equivalents thereof.

What is claimed is:

1. A memory device, comprising:
   memory cells;
   a plurality of data pins; and
   a separate only one serial command and address (SCA) pin, wherein data is transmitted over the plurality of data pins in response to a command and an address serially received over the separate only one SCA pin.

2. The memory device of claim 1, wherein the data pins are for bi-directional communication.

3. The memory device of claim 1, wherein the memory device comprises a NAND memory device.

4. The memory device of claim 1, wherein control signals for read/write operations of the memory device are provided on the separate only one SCA pin.

5. The memory device of claim 1, wherein all control signals for read/write operations of the memory device are provided on the separate only one SCA pin.

6. The memory device of claim 1, wherein the separate only one SCA pin is ready for the command responsive to a start condition being met.

7. The memory device of claim 1, wherein the start condition is met through receipt of a specific signal.

8. The memory device of claim 1, wherein an internal clock is shut down responsive to another command given on the separate only one SCA pin.

9. The memory device of claim 1, wherein the separate only one SCA pin is a bi-directional communication pin.

10. The memory device of claim 1, and further comprising a command control circuit to decode signals provided through the separate only one SCA pin.

11. A memory device, comprising:
    memory cells;
    a plurality of data pins; and
    a separate only one serial command and address (SCA) pin, wherein the separate only one serial command and address (SCA) pin controls transmission of data over the plurality of data pins;
    wherein the separate only one serial command and address (SCA) pin is a bi-directional communication pin.

12. A controller, comprising:
    a plurality of data pins to interface with a plurality of data pins of a memory device; and
    a separate only one serial command and address (SCA) pin to provide a command and an address to a separate only one SCA pin of the memory device, wherein data is transmitted over the plurality of data pins of the memory device in response to the command and the address.

13. The controller of claim 12, wherein the controller allows assertion of the separate only one SCA pin of the memory device even while the memory device is busy.

14. A processor, comprising:
    a plurality of data pins to interface with a plurality of data pins of a memory device; and a separate only one serial command and address (SCA) pin to provide a command and an address to a separate only one SCA pin of the memory device, wherein data is transmitted over the plurality of data pins of the memory device in response to the command and the address.

15. The processor of claim 14, wherein the processor uses logic to serially combine the command and the address.

16. The processor of claim 4, wherein the processor allows assertion of the separate only one SCA pin of the memory device even while the memory device is busy.

17. A method of operating a memory, comprising:
providing all commands and addresses for operating the memory serially on only one serial command and address (SCA) pin of the memory; and
transmitting data for the memory over a separate plurality of data pins in response to a command and an address received over the only one SCA pin.

18. The method of claim 17, wherein providing all commands and addresses further comprises pipelining commands to the memory on the only one SCA pin, wherein a second command is received and acknowledged while the memory is busy on a first command.

19. The method of claim 17, wherein control signals for read/write operations of the memory are provided on the only one SCA pin.

20. The method of claim 17, and further comprising shutting down an internal clock responsive to another command given on the only one SCA pin.

21. The method of claim 17, and further comprising decoding signals provided through the only one SCA pin with a command control circuit.

22. A method of operating a memory, comprising:
transmitting data on a plurality of DQ pins;
providing all command and address inputs serially on a separate only one non-DQ pin, wherein transmitting data is performed over the plurality of DQ pins in response to a command and an address received on the separate only one non-DQ pin.

23. The method of claim 22, wherein providing command and address inputs serially on a separate only one non-DQ pin further comprises:
providing a start instruction to commence serial input on the separate only one non-DQ pin;
providing a command on the separate only one non-DQ pin; and
providing an address for the command on the separate only one non-DQ pin.

24. The method of claim 22, and further comprising:
providing an end instruction on the s separate only one non-DQ pin.

25. The method of claim 22, wherein the start instruction is predefined.

26. The method of claim 22, and further comprising:
reducing standby current of the device by shutting down an internal clock of the system with a command on the separate only one non-DQ pin.

27. The method of claim 22, and further comprising:
issuing another command on the separate only one non-DQ pin while the memory is busy.

* * * * *

UNITED STATES PATENT AND TRADEMARK OFFICE
CERTIFICATE OF CORRECTION

| | | |
|---|---|---|
| PATENT NO. | : 8,953,396 B2 | Page 1 of 1 |
| APPLICATION NO. | : 13/073360 | |
| DATED | : February 10, 2015 | |
| INVENTOR(S) | : Ebrahim Abedifard | |

It is certified that error appears in the above-identified patent and that said Letters Patent is hereby corrected as shown below:

In the claims,

In column 7, line 8, in Claim 16, delete "claim 4," and insert -- claim 14, --, therefor.

Signed and Sealed this
Fifth Day of May, 2015

Michelle K. Lee
*Director of the United States Patent and Trademark Office*